United States Patent [19]

Deml et al.

[11] 4,032,343

[45] June 28, 1977

[54] METHOD FOR PRODUCTION OF ROTATIONALLY SYMMETRIC NON-SPHERICAL OPTICAL ELEMENTS

[75] Inventors: Reinhold Deml, Munich; Ulrich Greis, Weyarn; Wilhelm Kapfhammer, Munich, all of Germany

[73] Assignee: AGFA-Gevaert, A.G., Leverkusen, Germany

[22] Filed: Feb. 13, 1974

[21] Appl. No.: 442,140

[30] Foreign Application Priority Data

Mar. 14, 1973  Germany .......................... 2307158

[52] U.S. Cl. .................................... 96/38.3; 354/4; 355/2

[51] Int. Cl.² .......................................... G03C 5/00

[58] Field of Search ................ 96/38.3, 116; 355/2; 354/4

[56] References Cited

UNITED STATES PATENTS

| | | | |
|---|---|---|---|
| 2,183,204 | 12/1939 | Reynolds | 96/116 |
| 2,549,699 | 4/1951 | McLaughlin et al. | 355/2 |
| 2,758,504 | 8/1956 | Tindale | 355/2 |
| 3,101,646 | 8/1963 | Dymott et al. | 355/2 |
| 3,728,117 | 4/1973 | Heidenhahn et al. | 96/38.3 |

*Primary Examiner*—Edward C. Kimlin
*Attorney, Agent, or Firm*—Michael J. Striker

[57] ABSTRACT

A method and arrangement for the production of a rotationally symmetric, non-spherical optical element, in which one or more light beams are directed at a rotating light-sensitive medium, and a fixed opaque shield is situated over the light-sensitive medium to block a portion of the light beams from exposing the medium.

7 Claims, 8 Drawing Figures

METHOD FOR PRODUCTION OF ROTATIONALLY SYMMETRIC NON-SPHERICAL OPTICAL ELEMENTS

BACKGROUND OF THE INVENTION

The present invention relates to a method and arrangement for producing rotationally symmetric, non-spherical, optical images and elements.

Such an optical element may be a disk on which information is recorded in the form of diffraction or interference patterns by optical arrangements. The uses of such non-spherical optical elements are gaining increasing importance in modern coherent and incoherent optics. Applications range from simple exposure optics for pattern correction in imaging systems, to sophisticated coherent-optic analog computers for special mathematical functions and transformations.

The production of holograms is another important application. In reconstructing wavefronts by reading a hologram, one can in principle replace optical elements for producing particular light waves with a corresponding hologram. The production of a hologram presupposes the existence of the desired wavefront pattern, so that the optical element must already be on hand.

The production of holograms requires a very accurate optical technique and apparatus. The intervals of distance between wavefront peaks are very important for the accurate recording and reading out of a hologram. Computer synthesis of hologram patterns is just one very accurate, though very expensive, method for production of high quality holograms, as an alternative to the usual technique of glass optics.

SUMMARY OF THE INVENTION

An object of the invention is to provide a novel and improved method for production of rotationally symmetric, non-spherical, optical images and elements.

Another object of the invention is to provide an arrangement or apparatus for producing rotationally symmetric, non-spherical, optical images and elements.

Another object of the invention is to provide a method for producing a rotationally symmetric, non-spherical, optical disk for storing information in the form of diffraction image elements, from an image carrying light beam.

A further object of the invention is to provide a novel and improved exposing and blocking means associated with the recording of information on a rotating light-sensitive medium.

The invention is embodied in a method of exposing a rotating light-sensitive medium with at least one light beam, and blocking a portion of said light beam with an opaque shield, thereby preventing said portion from reaching the light-sensitive medium.

The purpose of the opaque shield or blocking means is to shield light so as to produce a two-dimensional pattern of light distribution, corresponding to the desired optical element to be produced, perpendicular to the direction of the radial from the axis of the medium and hence the direction of the non-blocked light slit. By developing, stabilizing, bleaching, or toning the resulting image, it is possible to produce a rotationally symmetric absorption and/or phase structure pattern element. The resulting optical image element may be used in another optical arrangement to reproduce an original image or other stored information.

The opaque shield or blocking means may be a disk-shaped element with a narrow sector cut out to expose the light-sensitive surface. The cut-out extends in a radial direction from the axis of rotation of the recording medium to its circumference.

It is advantageous to provide for the exposure of the recorded patterns in a radial direction from the axis of rotation of the disk. One may utilize a slit with a filter, the light transmissivity of which decreases in the direction towards the axis, or a sector-shaped slit which decreases in width in the direction towards the axis of rotation.

Furthermore, it is advantageous to increase the relative surface brightness in the region of the two-dimensional pattern by means of a focussing cylindrical optical element or lens situation on a perpendicular to the direction of the slit.

A two-dimensional pattern of varying light intensity can be created in a known manner through the interference of coherent light waves, or, equally as well, through the reproduction of images of an original with regions of various light transmissivity.

When, for example, a periodically repeating grid or lattice is used as the two-dimensional pattern, a corresponding transparent conical optical element is produced due to the rotation of the medium. When a cut-out or slit together with a zone lens is used, a corresponding torus-shaped optical element would be produced.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
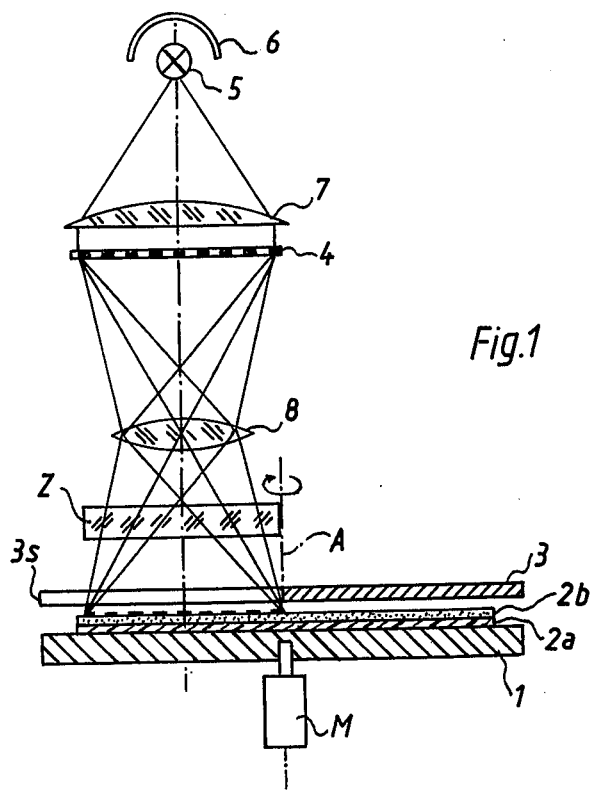
FIG. 1 is an cross section of the apparatus for recording of a rotationally symmetric pattern by projection of a two-dimensional pattern on a rotating light-sensitive disk.
Figure 3:
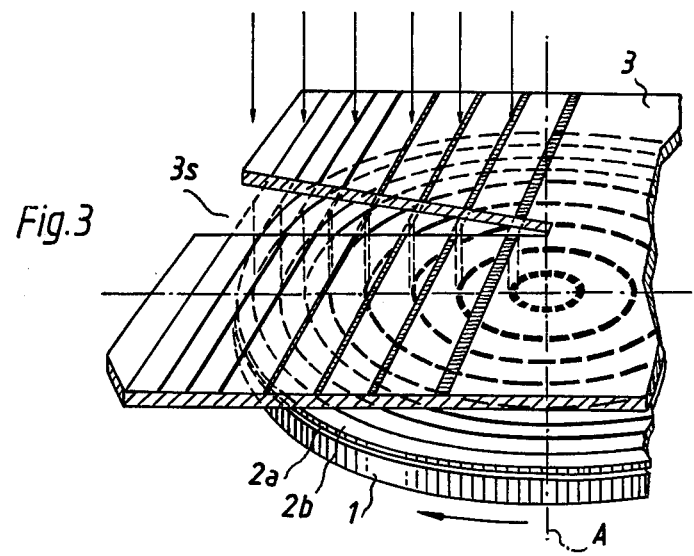
FIG. 3 is a perspective view of a portion of the apparatus for production of rotationally symmetric patterns illustrated in FIGS. 1 and 2.

In FIG. 1 there is illustrated a motor M rotating a turntable 1, on which is placed a carrier 2a having an upper light-sensitive surface, or film emulsion, 2b of the type discussed in U.S. Pat. Nos. 3,775,110; 3,893,856 and 3,948,660. Above the carrier 2a and 2b is located a fixed blind, or blocking means, 3 with a slit 3s therein extending from the axis of rotation A of the turntable to the peripheral edge of the fixed blind 3. The slit 3s is seen in another perspective in FIG. 3 as a sector of a circle; or in FIG. 3a as rectangular shaped, with a light filter V (not shown) whose light transmissivity increases with distance from the center of rotation A.

Figure 3A:
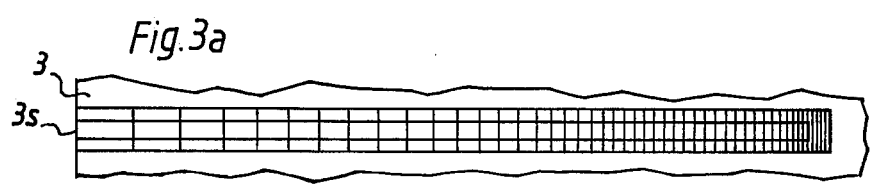
FIG. 3a is a top view of an alternative embodiment of the invention as illustrated in FIG. 3.

The design of the particular sector shape of the slit 3a is based on the face that the peripheral speed of the outer edge of the recording film emulsion 2b is greater than the portion closer to the axis A. Since the surface of the film emulsion 2b is uniform, the exposure time is also uniform over the surface. As a result, the emulsion on the outer edge surface of the carrier or disc 2a would require a longer exposure time to the light than the slower moving film emulsion on the inner portion of the carrier near the axis A. Therefore, the slit extends from the axis A and increased in width as it traverses the carrier to the circumference and the outer portion of the carrier. An equivalent method of achieving uniform exposure is to utilize a filter over a substantially rectangular-shaped slit, as seen in FIG. 3a, whose transmissivity to light increases with increasing distance from the center or axis A.

Furthermore, the invention provides for an intensity pattern which varies along the length of the slit. This effect is achieved through the use of a masking element 4 as seen in FIG. 1. Also seen in FIG. 1 is the light source 5, a reflecting mirror 6, a condenser lens 7, and a objective or projection lens 8. The mask may operate by having regions of different light transmissivity. It is also possible to utilize a fixed cylindrical lens Z above the light-sensitive surface and along the slit 3s.

Figure 2:
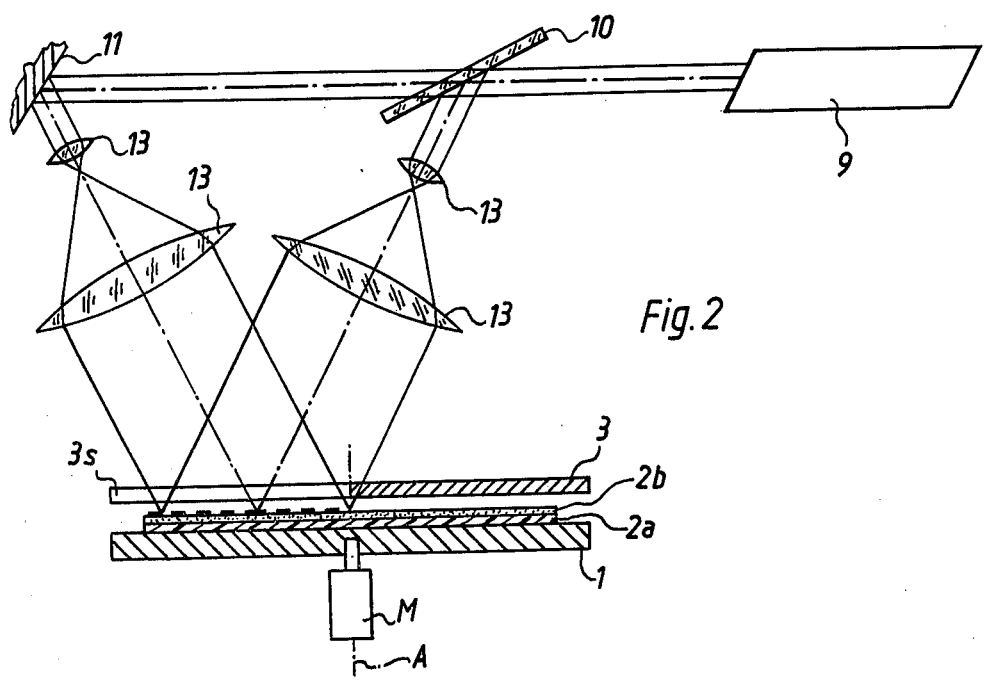
FIG. 2 illustrates an apparatus for production of rotationally symmetric patterns through interference of wavefronts of coherent light beams.

In another embodiment of the invention, it is possible to achieve variations in intensity through utilization of two or more coherent light beams to form an interference pattern, as illustrated in FIG. 2. The Figure shows a laser 9, a beam splitter 10, a reflecting mirror 11, and two known beam spreading units 13 for the emitted laser beam. An interference pattern between the two beams is produced on the light-sensitive surface in a well known manner, as illustrated in FIG. 2. The intensity pattern is a result of the differences between maxima and minima of the resulting interference pattern.

Figure 4A:
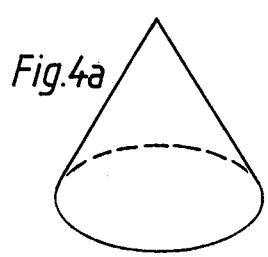
FIG. 4a is an rudimentary sketch of a certain refractive optical element.
Figure 4B:
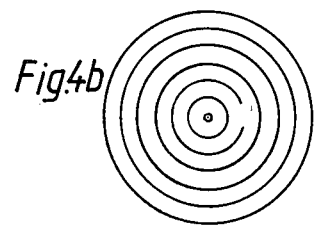
FIG. 4b is the corresponding diffractive element, produced by the invention.

FIG. 4a shows a conical-shaped transparent body, known as an "AXICON". The diffractive analogy 4b of the optical element seen in FIG. 4a is a system of concentric rings, equally spaced apart. Such an optical pattern can be produced by the described apparatus either through a lattice with equally spaced lines as in FIG. 1, or through an interference arrangement as in FIG. 2.

Figure 5A:
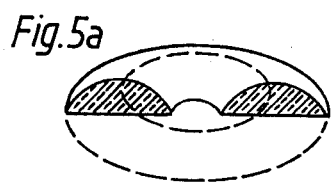
FIG. 5a is another refractive optical element.
Figure 5B:
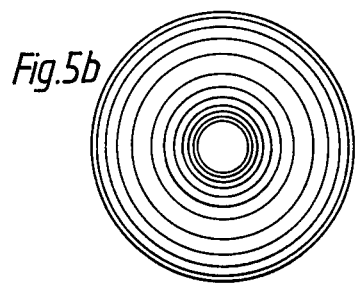
FIG. 5b is its corresponding diffractive optical element, produced by the invention.

FIG. 5a shows a torus-shaped optical element. The corresponding diffractive pattern 5b is a concentric ring system, where the distances between the concentric rings are smallest in the middle and at the circumference of the pattern. It is possible to achieve this type of optical pattern through the arrangement of FIG. 1, in which a Fresnel zone lens is utilized. It is also possible to use the apparatus of FIG. 2, in which an interference pattern of parallel beams of either convergent or divergent coherent laser beams form and expose the desired pattern.

The light-sensitive surface 2b is developed or stabilized in a well known manner following the exposure and, if desired, may be toned, or bleached to a desired consistency. Reference may be had to U.S. Pat. Nos. 3,775,119; 3,893,856 and 3,948,660.

The invention is not limited to the above described examples. For example, a section of a ring pattern or ring system formed by a Fabry-Perot interferometer can be utilized to produce a similar torus-shaped lenticular element. In general, the line width can be adjusted by the interference of several coherent light beams in which two beams form an interference pattern.

While the invention has been illustrated and described as embodied in a method and arrangement for production of rotationally symmetric non-spherical optical diffraction elements, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims:

1. A method of producing a rotationally symmetric non-sherical optical element, comprising the steps of rotating a planar, light-sensitive medium in its plane about an axis which extends normal to said plane; providing a source of coherent light; disposing intermediate said source and a major surface of said medium a stationary opaque shield having an opening extending radially from said axis of rotation towards a periphery of said major surface; and directing at least two beams of light from said source towards said surface in such a manner that said beams intersect and form an interference pattern, portions of said pattern being intercepted by said shield and the remaining portion exposing said medium in form of a rotationally symmetric two-dimensional pattern.

2. A method of producing a rotationally symmetric non-spherical optical element, comrising the steps of rotating a planar, light-sensitive medium in its plane about an axis which extends normal to said plane; directing a beam of light from a source towards a major surface of said planar medium which is bounded by a periphery thereof; disposing intermediate said source and said surface a stationary opaque shield having an opening extending radially from said axis of rotation towards said periphery; interposing between said source and said shield a masking element having regions of different light transmissivity and utilizing the same for varying the light intensity along the length of said opening, said shield and said masking element cooperating with one another to intercept a portion of said light beam so that the remaining portion of said light beam exposes said medium in form of a rotationally symmetric two-dimensional pattern and forms in said light-sensitive medium a permanent image corresponding to said rotationally symmetric pattern and to the light intensity that reaches and affects said light-sensitive medium.

3. Method as defined in claim 2, wherein said opening begins at said axis.

4. Method as defined in claim 3, wherein said opening of said shield is sector-shaped, said opening extends from said axis to the medium-circumference and the apex of said sector is at said axis.

5. Method as defined in claim 3, wherein said opening has a uniform width, and further comprising the step of placing a filter in said opening, said filter having a light transmissivity increasing in a radial direction from said axis.

6. Method as defined in claim 2, further comprising the step of focussing said light beam on said exposure region by a cylindrical optical system.

7. Method as defined in claim 2, wherein said masking element is a grid of constant period.

* * * * *